US010966300B2

(12) United States Patent
Hasnain et al.

(10) Patent No.: US 10,966,300 B2
(45) Date of Patent: *Mar. 30, 2021

(54) LIGHT SOURCES UTILIZING SEGMENTED LEDS TO COMPENSATE FOR MANUFACTURING VARIATIONS IN THE LIGHT OUTPUT OF INDIVIDUAL SEGMENTED LEDS

(71) Applicant: BRIDGELUX, INC., Fremont, CA (US)

(72) Inventors: Ghulam Hasnain, Palo Alto, CA (US); Syn-Yem Hu, San Jose, CA (US); Steven D. Lester, Palo Alto, CA (US)

(73) Assignee: BRIDGELUX, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/449,220

(22) Filed: Jun. 21, 2019

(65) Prior Publication Data

US 2020/0015335 A1    Jan. 9, 2020

Related U.S. Application Data

(60) Continuation of application No. 15/911,565, filed on Mar. 5, 2018, now Pat. No. 10,334,674, which is a
(Continued)

(51) Int. Cl.
*H05B 45/46* (2020.01)
*H01L 33/62* (2010.01)
(Continued)

(52) U.S. Cl.
CPC ......... *H05B 45/46* (2020.01); *H01L 25/0753* (2013.01); *H01L 33/62* (2013.01);
(Continued)

(58) Field of Classification Search
CPC ......... H01L 33/20; H01L 33/38; H01L 33/08; H01L 2924/12041; H01L 2924/14;
(Continued)

(56) References Cited

U.S. PATENT DOCUMENTS 4,198,629 A    4/1980  Marion
4,879,250 A   11/1989  Chan
(Continued)

FOREIGN PATENT DOCUMENTS

CN    1402880        3/2003
CN    1828921 A      9/2006
(Continued)

OTHER PUBLICATIONS

Decision on Appeal dated Aug. 11, 2015 regarding Japan Application No. JP2011-552045 and English translation.
(Continued)

*Primary Examiner* — Amy Cohen Johnson
*Assistant Examiner* — Jianzi Chen
(74) *Attorney, Agent, or Firm* — Arent Fox LLP

(57) ABSTRACT

A light source and method for making the same are disclosed. The light source includes a plurality of Segmented LEDs connected in parallel to a power bus and a controller. The power bus accepts a variable number of Segmented LEDs. The controller receives AC power and provides a power signal on the power bus. Each Segmented LED is characterized by a driving voltage that is greater than 3 times the driving voltage of a conventional LED fabricated in the same material system as the Segmented LED. The number of Segmented LEDs in the light source is chosen to compensate for variations in the light output of individual Segmented LEDs introduced by the manufacturing process.
(Continued)

In another aspect of the invention, the number of Segmented LEDs connected to the power bus can be altered after the light source is assembled.

22 Claims, 6 Drawing Sheets

Related U.S. Application Data continuation of application No. 15/464,200, filed on Mar. 20, 2017, now Pat. No. 9,913,333, which is a continuation of application No. 14/752,647, filed on Jun. 26, 2015, now Pat. No. 9,634,062, which is a continuation of application No. 13/080,439, filed on Apr. 5, 2011, now Pat. No. 9,472,593, which is a division of application No. 12/393,910, filed on Feb. 26, 2009, now Pat. No. 7,982,409.

(51) Int. Cl.
| | | |
|---|---|---|
| *H01L 25/075* | (2006.01) | |
| *H05B 45/10* | (2020.01) | |
| *H05B 45/48* | (2020.01) | |
| *H05B 45/50* | (2020.01) | |
| *H05B 47/185* | (2020.01) | |
| *H05B 33/10* | (2006.01) | |
| *H01L 27/15* | (2006.01) | |

(52) U.S. Cl.
CPC ............ *H05B 33/10* (2013.01); *H05B 45/10* (2020.01); *H05B 45/48* (2020.01); *H05B 45/50* (2020.01); *H05B 47/185* (2020.01); *H01L 27/153* (2013.01); *H01L 2924/0002* (2013.01); *H01L 2933/0066* (2013.01)

(58) Field of Classification Search
CPC ............ H05B 33/0827; H05B 33/0815; H05B 33/083; H05B 33/0845
See application file for complete search history.

(56) References Cited

U.S. PATENT DOCUMENTS

| | | | |
|---|---|---|---|
| 6,307,218 | B1 | 10/2001 | Steigerwald et al. |
| 6,410,942 | B1 | 6/2002 | Thibeault et al. |
| 6,547,249 | B2 | 4/2003 | Collins, III et al. |
| 6,614,056 | B1 | 9/2003 | Tarsa et al. |
| 6,869,812 | B1 | 3/2005 | Liu |
| 6,885,036 | B2 | 4/2005 | Tarsa et al. |
| 7,161,784 | B2 | 1/2007 | Cheung et al. |
| 7,482,760 | B2 | 1/2009 | Jungwirth et al. |
| 7,560,738 | B2 | 7/2009 | Liu |
| 7,700,960 | B2 | 4/2010 | Kim et al. |
| 8,081,413 | B2 | 12/2011 | Kothari et al. |
| 2002/0139987 | A1 | 10/2002 | Collins et al. |
| 2004/0080941 | A1 | 4/2004 | Jiang et al. |
| 2004/0190284 | A1 | 9/2004 | Yang |
| 2006/0138447 | A1 | 6/2006 | Schoo et al. |
| 2006/0163589 | A1* | 7/2006 | Fan .................... H01L 27/153 257/88 |
| 2007/0065962 | A1 | 3/2007 | Pichler |
| 2007/0102693 | A1 | 5/2007 | Nagai |
| 2007/0128905 | A1 | 6/2007 | Speakman |
| 2007/0210722 | A1 | 9/2007 | Konno et al. |
| 2007/0216322 | A1 | 9/2007 | Kim |
| 2008/0122832 | A1 | 5/2008 | Chen et al. |
| 2008/0169532 | A1 | 7/2008 | Nakahata |
| 2008/0179404 | A1 | 7/2008 | Finn |
| 2008/0195180 | A1 | 8/2008 | Stevenson et al. |
| 2008/0230765 | A1 | 9/2008 | Yoon et al. |
| 2010/0059768 | A1 | 3/2010 | Hasnain |
| 2010/0141175 | A1 | 6/2010 | Hasnain et al. |

FOREIGN PATENT DOCUMENTS

| | | |
|---|---|---|
| CN | 101038398 | 9/2007 |
| JP | 2002359402 | 12/2001 |
| JP | 2003005674 | 1/2003 |
| JP | 2005317931 | 11/2005 |
| JP | 2007134430 | 5/2007 |
| JP | 2007242427 | 9/2007 |
| JP | 2008544569 | 12/2008 |
| JP | 2009009817 | 1/2009 |
| JP | 2009009846 | 1/2009 |
| KR | 10-20070063977 | 6/2007 |
| TW | 540169 B | 7/2003 |
| TW | 200902914 | 1/2009 |
| WO | 2004023568 | 3/2004 |
| WO | 2007001116 | 1/2007 |

OTHER PUBLICATIONS

Decision of Final Rejection dated Jun. 30, 2015, regarding Japan Application No. JP2014-096543 and English translation.
Partial Supplementary European Search Report dated May 27, 2015, regarding EP Application No. EP10746598.
Fourth Office Action dated Feb. 28, 2015, regarding China Application No. 2010-80007439.7.
Reexamination Report dated Feb. 4, 2015 regarding JP2011-552045.
Office Action dated Feb. 12, 2015 regarding JP2014-096543.
PCT Search Report and Written Opinion dated Aug. 20, 2010 in PCT/US2010/022105.
China First Office Action dated Mar. 5, 2013 re China Patent Application No. 201080007439.7.
China Second Office Action dated Jan. 22, 2014 re China Patent Application No. 201080007439.7.
Japan Office Action dated Jan. 28, 2014 re Japan Patent Application No. 2011-552045.
Third Office Action dated Aug. 15, 2014, regarding China Application No. 201080007439.7.
First Office Action dated Aug. 25, 2014, and Search Report regarding Taiwan Application No. TW99102987.
Japanese Decision of Final Rejection dated Jul. 29, 2014 regarding Japan Application No. JP2011-552045.
Fifth Office Action dated Sep. 15, 2015 regarding China Application No. 201080007439.7.
EP Communication dated Oct. 8, 2015 enclosing Supplementary EP Search Report and Search Opinion dated May 27, 2015, regarding EP10746598.
Notice of Grounds for Rejection dated Jan. 22, 2016, regarding Korean Application No. 2011-7019542.
Decision to Grant a Patent dated Jan. 19, 2016, regarding Japanese Patent Application JP2014-096543.
Japanese Office Action dated Feb. 2, 2016 regarding Japanese Patent Application No. 2015-100961.
Japanese Publication JP2015-188094, regarding JP Application No. 2015-100961. For corresponding English document, see US Pub. US20100141175 (and references cited from U.S. Pat. No. 7,939,839 which issued therefrom).
International Search Report and Written Opinion dated Apr. 7, 2010, regarding PCT/US2009/054456.
Notice of Final Rejection dated Jun. 28, 2016, regarding Korean Application No. KR10-2016-7007577 and English translation.
Notice of Final Rejection dated Sep. 20, 2016, regarding Japanese Patent Application No. 2015-100961 and English translation.
Notice of Final Rejection dated May 25, 2016, regarding Korean Application No. 2011-7019542 and English translation.
Korean Grounds for Final Rejection dated Apr. 7, 2016, regarding Korean Patent Application No. KR2011-07019542, and English translation.
Korean Notice of Grounds for Rejection dated Apr. 15, 2016, regarding Korean Patent Application No. KR2016-7007577, and English translation.
Notification of First Office Action dated Sep. 4, 2017, regarding Chinese Patent Application No. 201511008977.9.

(56) References Cited

OTHER PUBLICATIONS

Communication pursuant to Article 94(3) EPC dated Apr. 6, 2018, regarding EP Patent Application No. 10746598.
Notification of the Second Office Action dated Jul. 25, 2018, regarding Chinese Patent Application No. 201511008977.9 with English Translation.
Notification of the Third Office Action dated Dec. 26, 2018, regarding Chinese Patent Application No. 201511008977.9 with English Translation.

* cited by examiner

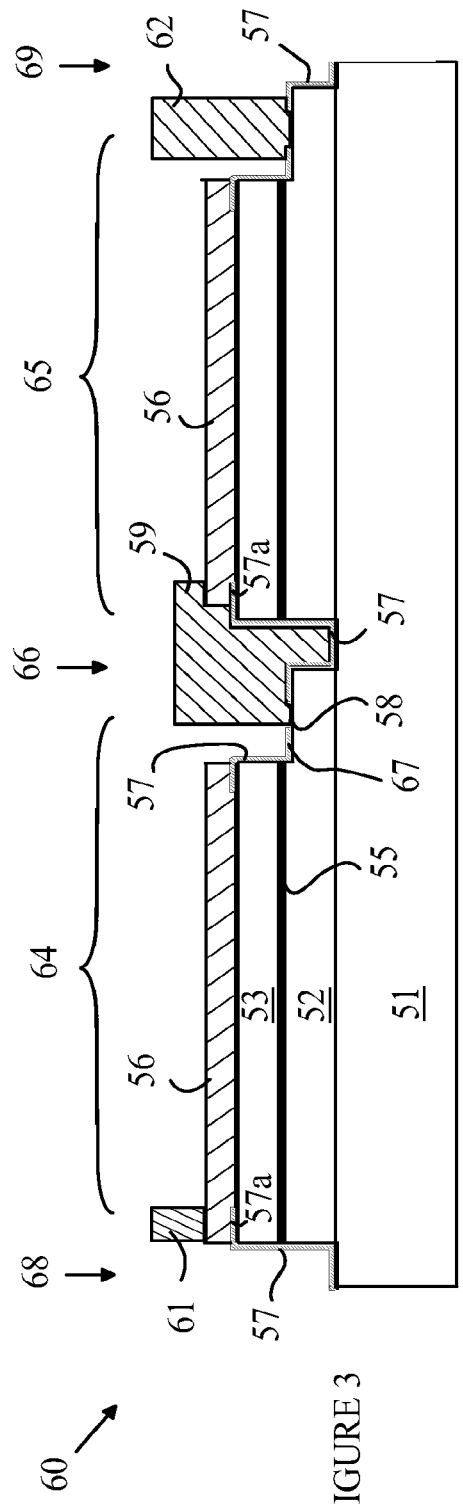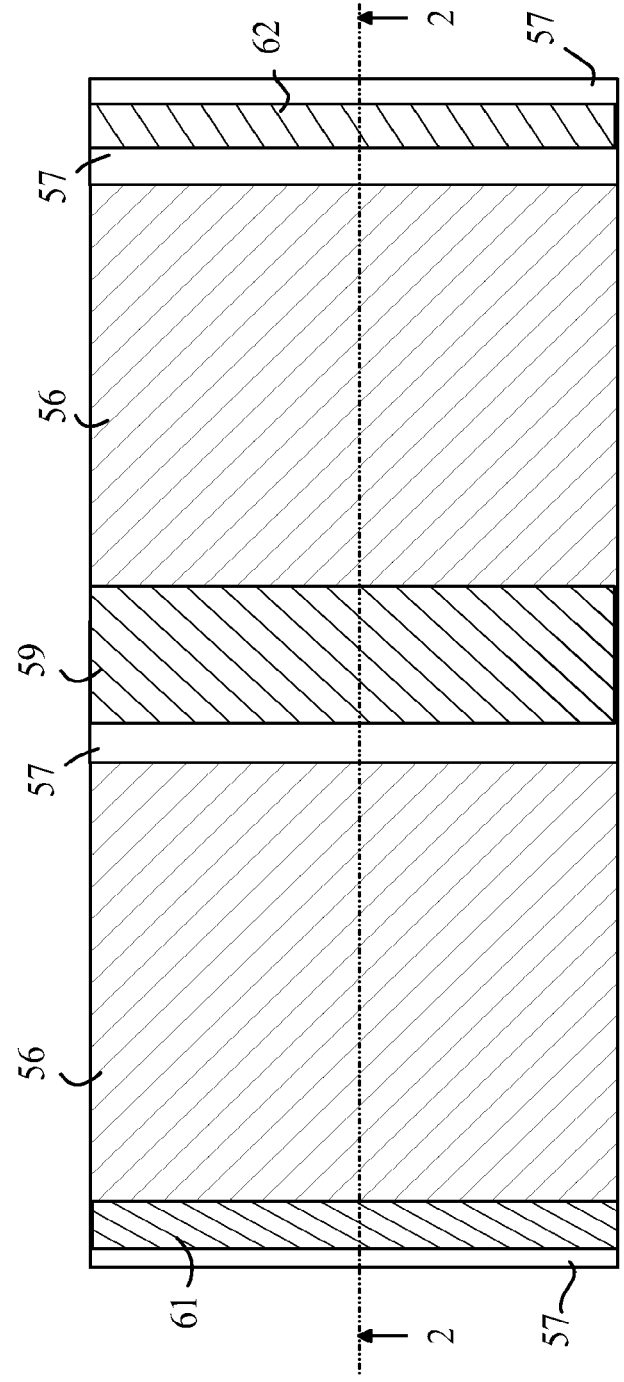

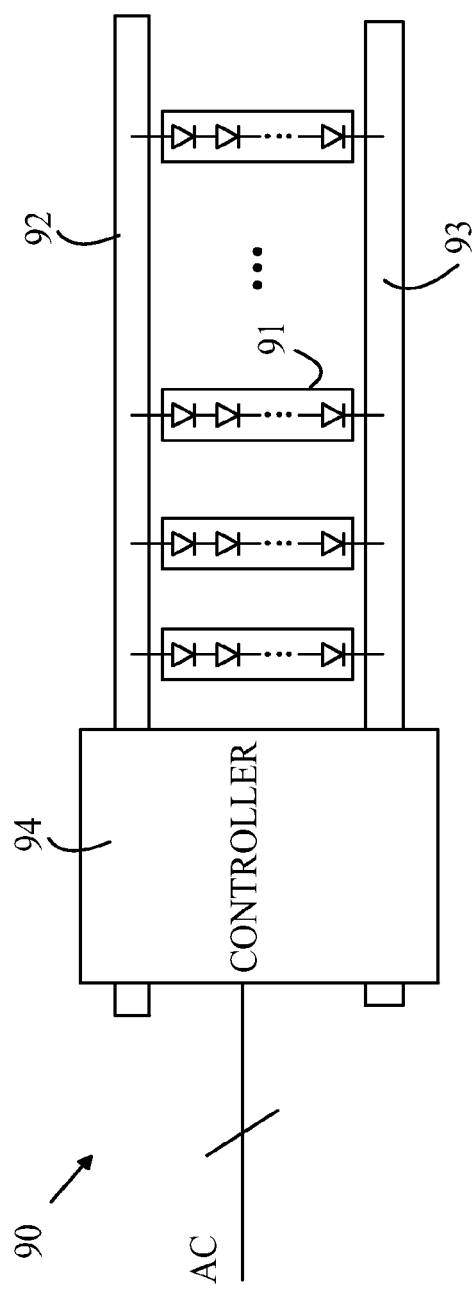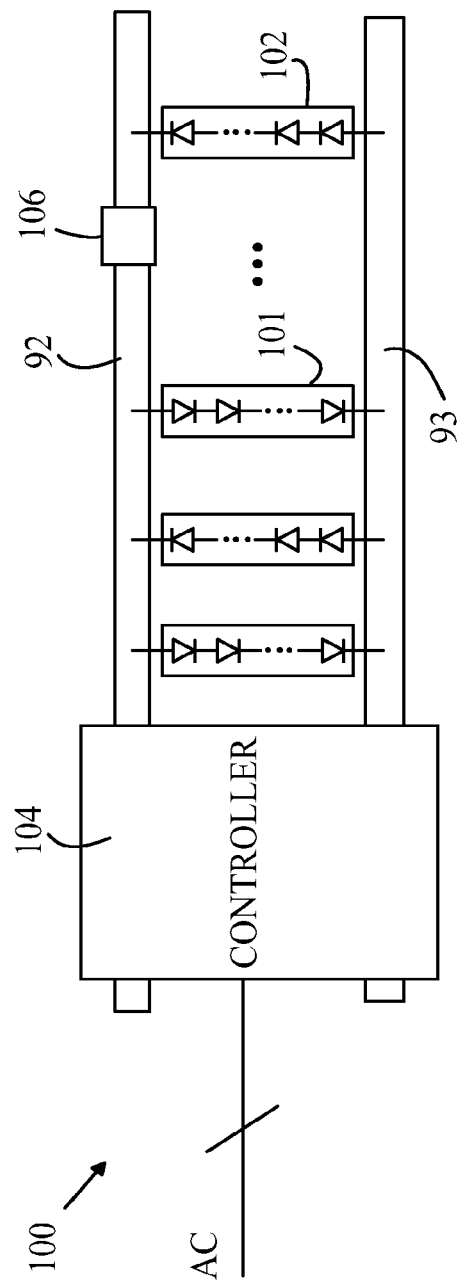

LIGHT SOURCES UTILIZING SEGMENTED LEDS TO COMPENSATE FOR MANUFACTURING VARIATIONS IN THE LIGHT OUTPUT OF INDIVIDUAL SEGMENTED LEDS

CROSS-REFERENCE TO RELATED APPLICATIONS

This application is a continuation of U.S. patent application Ser. No. 15/911,565, filed Mar. 5, 2018, now U.S. Pat. No. 10,334,674, which is a continuation of U.S. patent application Ser. No. 15/464,200, filed Mar. 20, 2017, now U.S. Pat. No. 9,913,333, which is a continuation of U.S. patent application Ser. No. 14/752,647, filed Jun. 26, 2015, now U.S. Pat. No. 9,634,062, which is a continuation of U.S. patent application Ser. No. 13/080,439, filed Apr. 5, 2011, now U.S. Pat. No. 9,472,593, which is a divisional of U.S. patent application Ser. No. 12/393,910, filed Feb. 26, 2009, now U.S. Pat. No. 7,982,409, the disclosures of each of which are hereby incorporated by reference in their entireties.

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

For the purposes of this discussion, an LED can be viewed as having three layers, the active layer sandwiched between two other layers. The active layer emits light when holes and electrons from the outer layers combine in the active layer. The holes and electrons are generated by passing a current through the LED. The LED is powered through an electrode that overlies the top layer and a contact that provides an electrical connection to the bottom layer.

The cost of LEDs and the power conversion efficiency are important factors in determining the rate at which this new technology will replace conventional light sources and be utilized in high power applications. The conversion efficiency of an LED is defined to be the ratio of optical power emitted by the LED in the desired region of the optical spectrum to the electrical power dissipated by the light source. The electrical power that is dissipated depends on the conversion efficiency of the LEDs and the power lost by the circuitry that converts AC power to a DC source that can be used to directly power the LED dies. Electrical power that is not converted to light that leaves the LED is converted to heat that raises the temperature of the LED. Heat dissipation often places a limit on the power level at which an LED operates. In addition, the conversion efficiency of the LED decreases with increasing current; hence, while increasing the light output of an LED by increasing the current increases the total light output, the electrical conversion efficiency is decreased by this strategy. In addition, the lifetime of the LED is also decreased by operation at high currents.

Single LED light sources are not capable of generating sufficient light to replace conventional light sources for many applications. In general, there is a limit to the light per unit area of LED that can be practically generated at an acceptable power conversion efficiency. This limit is imposed by the power dissipation and the electrical conversion efficiency of the LED material system. Hence, to provide a higher intensity single LED source, larger area chips must be utilized; however, there is a limit to the size of a single LED chip that is imposed by the fabrication process used to make the LEDs. As the chip size increases, the yield of chips decreases, and hence, the cost per LED increases faster than the increase in light output once the chip size increases beyond a predetermined size.

Hence, for many applications, an LED-based light source must utilize multiple LEDs to provide the desired light output. For example, to replace a 100-watt incandescent bulb for use in conventional lighting applications, approximately 25 LEDs having chips of the order of 1 mm2 are required. This number can vary depending on the color temperature desired and the exact size of the chips.

In addition, the light source typically includes a power supply that converts either 115V or 240V AC power to a DC level compatible with driving the LEDs. The conversion efficiency of this power supply, often 80% or less in cost-competitive products, also contributes to the overall power-to-light conversion efficiency of the light source. To provide the maximum power delivery efficiency, the output of the power supply should be near the peak voltage of the AC power, and the current that must be delivered across the various conductors in the light source should be minimized to avoid resistive losses in the conductors. A typical GaN LED requires a drive voltage of about 3.2-3.6V. Hence, from a power conversion efficiency point of view, the 25 LED light source described above would be constructed as a single string of 25 LEDs connected in series with an output voltage level from the power supply of approximately 80 volts.

However, there are other considerations such as the cost and reliability of the light source that must be taken into consideration in addition to the power-to-light conversion efficiency. From a reliability point of view, a single series connected string of LEDs is the poorest option. In general, LEDs are more likely to fail by forming an open circuit than a short circuit. For example, a wire-bond that connects a pad in the LED to external circuitry can fail. Hence, a single LED failure in the series-connected string leads to the catastrophic failure of the light source.

From a reliability point of view, a light source in which all of the LEDs are connected in parallel would appear to be the best if the predominant failure mechanism is LEDs failing by forming open circuits. If a single LED fails and a constant current source is used to drive the parallel connected LEDs, the current through the other LEDs will increase slightly, and hence, the other LEDs will partially compensate for the light lost when one of the LEDs fails. Unfortunately, such an arrangement is inefficient from the point of view of the power supply efficiency and requires conductors that can handle very large currents without introducing significant transmission costs.

In addition to reliability and power conversion efficiency, the designer must provide a design that can accommodate the variations in the light generation efficiency among individual LEDs. LEDs are fabricated on wafers that have some degree of non-uniformity across the wafer as well as variations from wafer to wafer. As a result, the amount of light generated by commercially available LEDs has a significant variation from LED to LED. The allowable variation in the light output of the final light source is determined by the need to have light sources that all generate the same amount of light and have the same appearance. In general, the variation in light output among the LEDs is too great to meet the needs of the light source manufacturers without some sorting of the LEDs to provide LEDs with less variability. The sorting process adds to the costs of the light source. In addition, many light sources cannot utilize LEDs that are not within a range of intensities that is less than the spread in intensities of the LEDs as manufactured. As a result, there is less of a market for LEDs that are not in the range of interest, which increases the cost of the LEDs in the desired range and decreases the cost of the LEDs that are outside that range.

The problems inherent in balancing reliability against power supply efficiency are reduced by constructing light sources in which a plurality of component light sources are connected in parallel. Each component light source consists of a plurality of LEDs connected in series, and hence, utilizes a significantly higher driving voltage than the individual LEDs. For example, a typical GaN LED requires a drive voltage of about 3.2 volts and a current of 0.35 amps. To provide a light source having approximately 2000 lumens, 25 such LEDs must be driven. The light source can be constructed by connecting 5 component light sources in parallel. Each component light source consists of 5 LEDs connected in series. Hence, the driving voltage is improved by a factor of 5 to 16V. If one LED fails by becoming an open circuit, the remaining 4 component light sources still function, and hence, the light source continues to function, albeit at a reduced brightness. However, the remaining LEDs are overdriven by 20 percent since these LEDs must pass the current that no longer passes through the open circuited component light source. As a result, the lifetimes of the remaining LEDs is significantly shortened.

Unfortunately, this strategy does not eliminate the need for utilizing only a subset of the production run of LEDs for any given final light source.

SUMMARY OF THE INVENTION

The present invention includes a light source and method for making the same. The light source includes a plurality of Segmented LEDs connected in parallel to a power bus and a controller. The power bus accepts a variable number of Segmented LEDs, the number being chosen to provide a predetermined light output for the light source. The controller receives AC power and provides a power signal on the power bus. In one aspect of the invention, each Segmented LED is characterized by a driving voltage that is greater than 3 times the driving voltage of a conventional LED fabricated in the same material system as the Segmented LED. The number of Segmented LEDs in the light source is chosen to compensate for variations in the light output of individual Segmented LEDs introduced by the manufacturing process. In another aspect of the invention, the number of Segmented LEDs connected to the power bus can be altered after the light source is assembled.

BRIEF DESCRIPTION OF THE DRAWINGS

FIG. 2 is a top view of Segmented LED 60.

FIG. 3 is a cross-sectional view of Segmented LED 60 through line 2-2 shown in FIG. 2.

FIG. 8 illustrates a light source according to another embodiment of the present invention.

FIG. 9 illustrates an AC light source according to another embodiment of the present invention.

DETAILED DESCRIPTION OF THE PREFERRED EMBODIMENTS OF THE INVENTION

Figure 1:
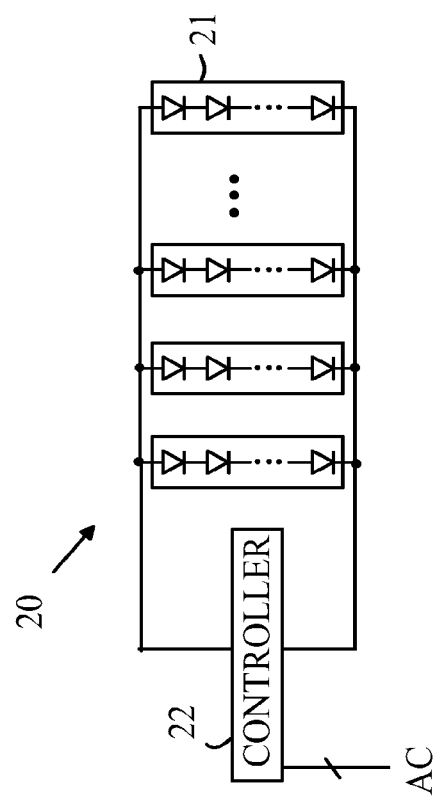
FIG. 1 illustrates one embodiment of a light source according to the present invention.

The manner in which the present invention provides its advantages can be more easily understood with reference to FIG. 1, which illustrates one embodiment of a light source according to the present invention. Light source 20 includes a plurality of Segmented LEDs 21 that are connected in parallel to a DC constant current source. The average current through each Segmented LED is set by controller 22, which includes an AC to DC power converter.

Segmented LEDs are discussed in detail in co-pending U.S. patent application Ser. No. 12/208,502, filed Sep. 11, 2008, which is hereby incorporated by reference. A detailed discussion of a Segmented LED will also be provided below. For the purposes of the present discussion, it is sufficient to note that each Segmented LED is defined to be a single LED die that is divided into N segments that are serially connected to one another, where N>1 and typically between 2 and 100. Each segment is, in effect, a small LED. The area of each Segmented LED is N times smaller than the area of a conventional LED, and hence, each Segmented LED generates substantially the same amount of light as a conventional LED but with 1/N times the current i.e. at the same areal current density. However, the driving voltage needed to run a segmented LED is substantially equal to N times the voltage needed to run a conventional LED in the same material system. Note therefore the segmented LED produces substantially the same amount of light with the same electrical power input as a conventional LED chip of the same size, except the current required is N times smaller but voltage required is N times larger. A segmented LED can be considered to be a replacement for a series-connected string of N smaller LED chips, each of which being substantially 1/N times the size of the conventional LED chip. The Segmented LED, however, generates only 1/N of the light of a component light source composed of N series-connected conventional LEDs. As a result, a light source that required 25 conventional LEDs connected as 5 component light sources, consisting of 5 series-connected conventional LEDs, connected in parallel, now requires 25 segmented LEDs connected in parallel. Hence, each segmented LED accounts for only $1/25^{th}$ of the light output. As a result, the output of light source 20 can be fine tuned by adding or removing individual segmented LEDs.

In contrast, the light output of the equivalent light source utilizing the serial-connected strings of conventional LEDs cannot be easily tuned by adding or subtracting a single LED. Changing the number of LEDs in one of the serial connected component strings presents challenges, since adding or subtracting an LED changes the driving voltage of that string. Hence, a separate power source would be needed for each component string, which would increase the cost of the light source. To avoid this, all of the component strings would need to be modified, and hence, 5 LEDs would need to be added or removed. Similarly, adding or removing one entire series-connected string from the power rails changes the light output by 5 LEDs or 20%. Hence, designs that utilize component strings consisting of N serially-connected strings of conventional LEDs are limited to adding or replacing N LEDs at a time. This limits the degree to which a design can be tuned by changing the number of conventional LEDs in the design.

In principle, the conventional light source design could utilize conventional LEDs that are 1/N smaller in size so that adding or removing N LEDs provides the same degree of tuning as the present invention. However, such a design has N times more LEDs, which increases the cost of manufacture.

The embodiments of the present invention described above depend on a Segmented LED. Refer now to FIGS. 2 and 3, which illustrate a segmented LED light source that could be utilized with the present invention. FIG. 2 is a top view of Segmented LED 60, and FIG. 3 is a cross-sectional view of Segmented LED 60 through line 2-2 shown in FIG. 2. Segmented LED 60 includes two segments 64 and 65; however, it will be apparent from the following discussion that light sources having many more segments can be constructed from the teachings of the present invention. Segmented LED 60 is constructed from the same three-layer LED structure in which the layers are grown on a sapphire substrate 51. The n-layer 52 is grown on substrate 51, and then the active layer 55 and p-layer 53 are grown over n-layer 52.

The segments 64 and 65 are separated by an isolation trench 66 that extends through layer 52 to substrate 51 thereby electrically isolating segments 64 and 65. Isolation trench 66 includes a plateau 67 that extends only partially into layer 52. The walls of isolation trench 66 are covered by an insulating layer 57 that includes an open area 58 for making electrical contact to the portion of layer 52 associated with each segment. Insulating layer 57 can be constructed from any material that provides an insulating layer that is free of pinhole defects. For example, SiNx, SiOx, or other such dielectric films commonly used in semiconductor device fabrication can be used as the insulating material. Other materials can include polyimide, BCB, spin-on-glass and materials that are routinely used in the semiconductor industry for device planarization.

Similar trenches are provided on the ends of Segmented LED 60 as shown at 68 and 69. A serial connection electrode 59 is deposited in isolation trench 66 such that electrode 59 makes contact with layer 52 through opening 58 in insulating layer 57. Electrode 59 also makes electrical contact with ITO layer 56 in the adjacent segment. Hence, when power is provided via electrodes 61 and 62, segments 64 and 65 are connected in series. As a result, Segmented LED 60 operates at twice the voltage and half the current as a conventional LED.

In one aspect of the present invention, insulating layer 57 extends under electrodes 59 and 61 as shown at 57a in FIG. 3. Since electrode 59 is opaque, electrode 59 blocks light generated in the portion of active layer 55 immediately underlying electrode 59. In this regard, it should be noted that the thickness of the layers shown in the figures is not to scale. In practice, the thickness of layer 53 is much smaller than that of layer 52 and also much smaller than the typical width of electrodes 59 or 61, and hence, electrode 59 blocks most of the light that is generated under electrode 59. Accordingly, current that passes through layer 55 under electrode 59 is substantially wasted, since most of the light generated by that current is lost (absorbed by the opaque metal in multiple reflections). The insulating layer extension blocks current from flowing through this wasted area of layer 55, and hence, improves the overall efficiency of the light source. A similar issue is present under electrode 61, and hence, the insulating layer is extended under that electrode as well.

Figure 4:
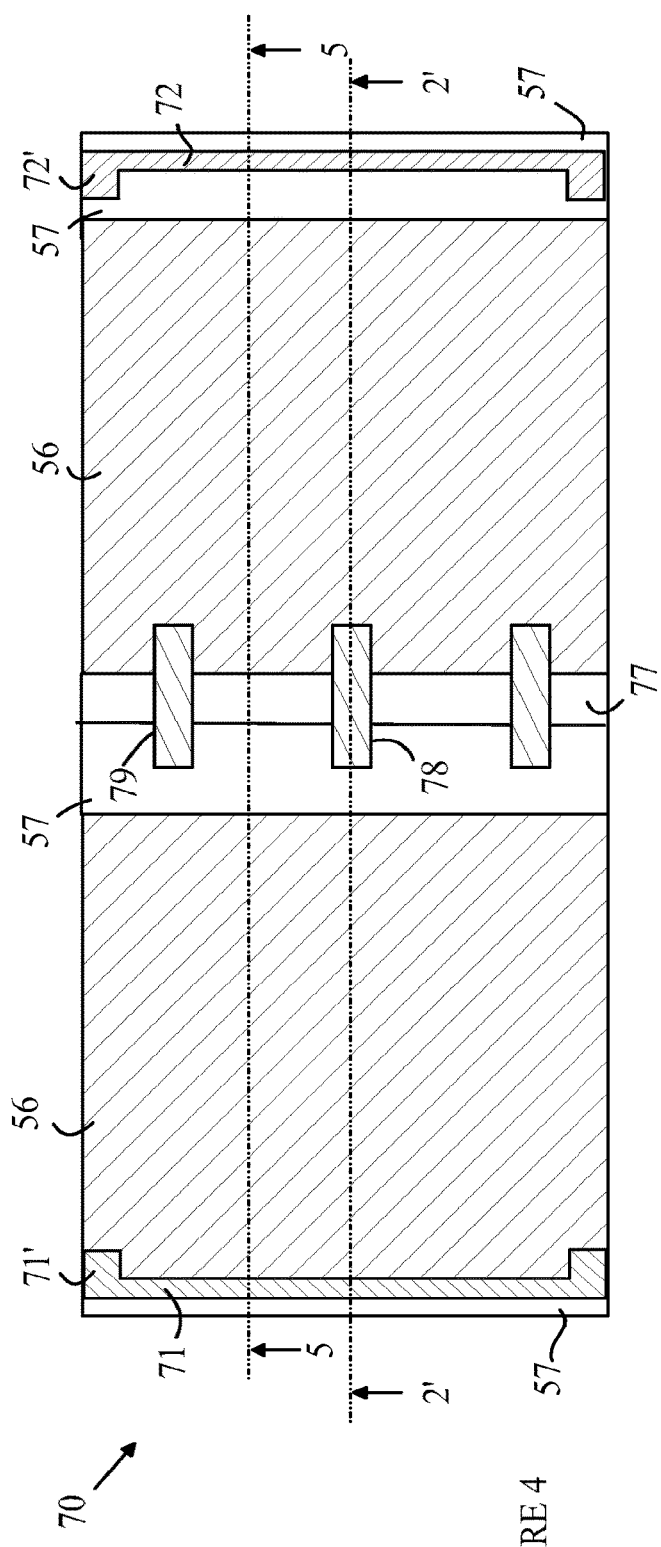
FIG. 4 is a top view of Segmented LED 70 showing the narrow p- and n-electrodes in adjacent segments that are connected by a set of interconnect electrodes.
Figure 5:
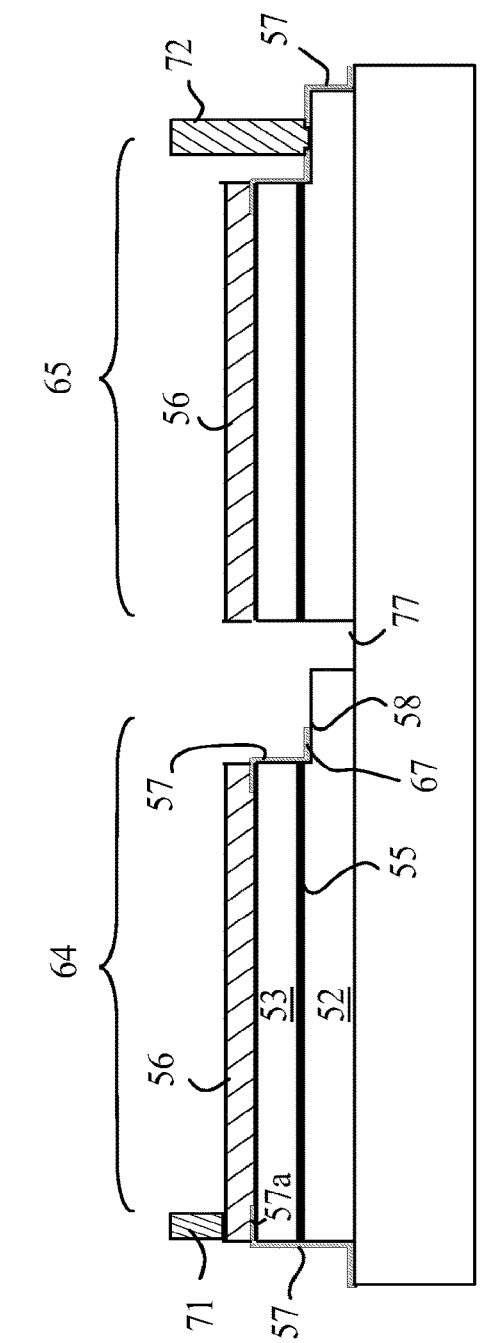
FIG. 5 is a cross-sectional view of Segmented LED 70 through line 5-5 shown in FIG. 4.

In the embodiments shown in FIGS. 2 and 3, electrode 59 extends over the entire width of Segmented LED 60. As noted above, the portion of segment 65 that underlies electrode 59 is non-productive and optically lossy, since light generated below electrode 59 is blocked and absorbed by electrode 59. This leads to reduced light conversion efficiency as well as reduced efficiency of utilization of the die surface, and hence, increased cost for the light source since additional active die area must be provided to compensate for this lost area. Refer now to FIGS. 4 and 5, which illustrate another embodiment of a segmented LED that can be utilized with the present invention. FIG. 4 is a top view of Segmented LED 70, and FIG. 5 is a cross-sectional view of Segmented LED 70 through line 5-5 shown in FIG. 4. The cross-sectional view of Segmented LED 70 through line 2'-2' shown in FIG. 4 is substantially the same as that shown in FIG. 2 with the exception of electrode 59 which would be replaced by electrode 78 and the narrow n- and p-electrodes 71 and 72 shown in FIG. 4; hence, this cross-sectional view has been omitted from the drawings.

Segmented LED 70 differs from Segmented LED 60 in that the wide interconnect electrode 59 has been replaced by a plurality of serial electrodes such as electrodes 78 and 79. These electrodes can be only 5-10 microns wide and spaced approximately 150 microns apart, and thus, cover a much smaller area on segment 65 than electrode 59. Accordingly, the loss in efficiency discussed above is substantially reduced. In addition, the n-electrode 72 and p-electrode 71 have been replaced by narrow electrodes that include wider pads 71' and 72' for wire bonding to external circuitry. In one preferred embodiment, the serial electrodes are spaced apart by a distance that is more than 5 times the width of the electrodes so that the area covered by the serial electrodes is significantly less than the width of the segments that are being connected in the Segmented LED.

The number of serial connection electrodes that are needed depends on the conductivity of ITO layer 56. There must be sufficient serial connection electrodes to assure that current is spread evenly over ITO layer 56. The width of the serial connection electrodes is set by the amount of current that must be passed between segments, and hence, depends on the conductor used, the thickness of the conductor, and the number of serial connection electrodes. In the regions of segment 65 that are not covered by a serial connection layer, the isolation trench 77 does not require an insulating layer, and hence, the underlying LED structure receives power and generates useful light.

Figure 6:
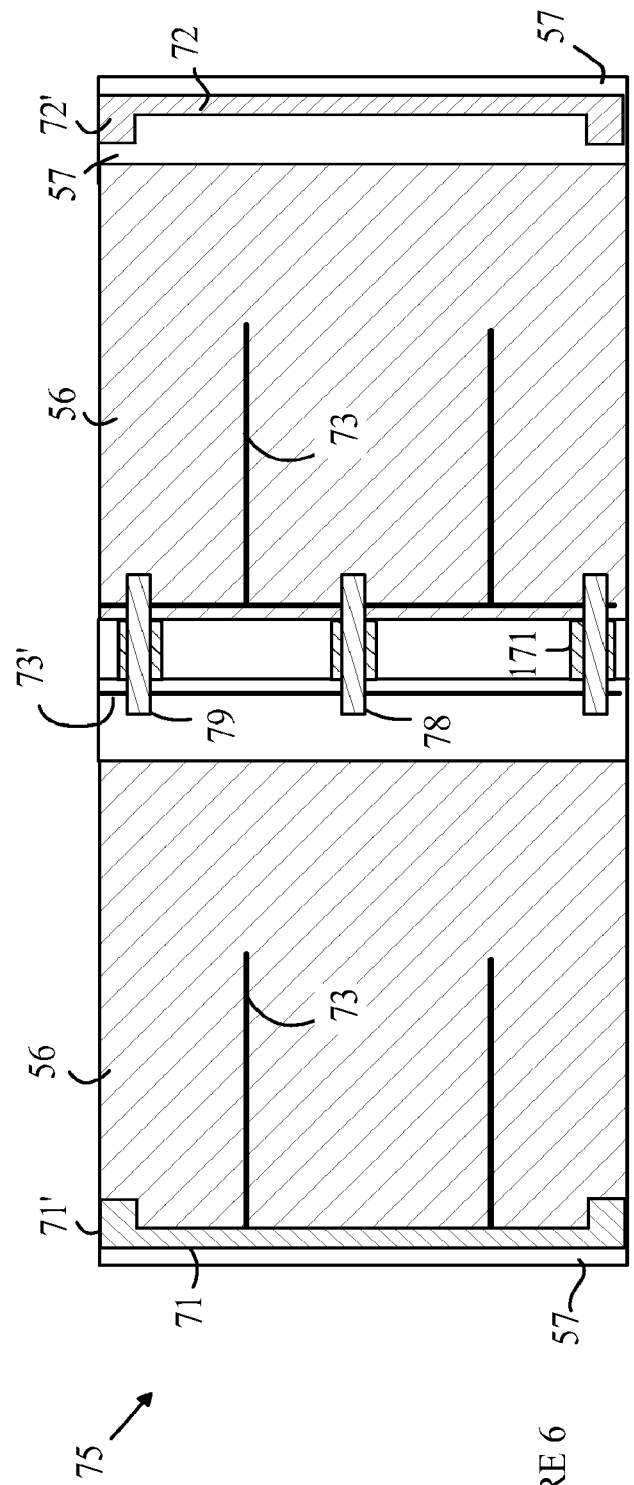
FIG. 6 is a top view of a segmented LED 75 that includes metal electrodes that enhance the current spreading on the ITO layer

The distribution of current on ITO layer 56 can be improved by incorporating a number of narrow metal electrodes on the surface of ITO layer 56. Refer now to FIG. 6, which is a top view of a segmented LED 75 that includes metal electrodes that enhance the current spreading on the ITO layer. Electrodes 73 are connected to the p-electrode 71 and to the serial connection electrodes between segments. The conductivity of the metal electrodes is much greater than that of the ITO layer, and hence, these very thin electrodes can provide increased current spreading without blocking a significant fraction of the light generated in the underlying structures. In one aspect of the invention, the area blocked by the electrodes is less than 20 percent of the light emitting area, and preferably less than 10 percent.

An optional thin n-electrode 73' can be incorporated on the exposed n-layer to enhance the spreading of current on the n-layer. This electrode does not block the generation of light, and hence, electrode 73' can cover a larger area than electrodes 73.

The serial connection electrodes can be constructed by depositing a layer of any suitable conductor over an insulating pad that is deposited in the isolation trench that separates the segments. Such an insulating pad is shown at 171. It should be noted that the serial connection electrodes can be constructed from metals or ITO. ITO has the advantage of being more transparent, and hence, less light is blocked by the serial connection electrodes. However, ITO is more resistive, and hence, a larger area may be needed.

Figure 7:
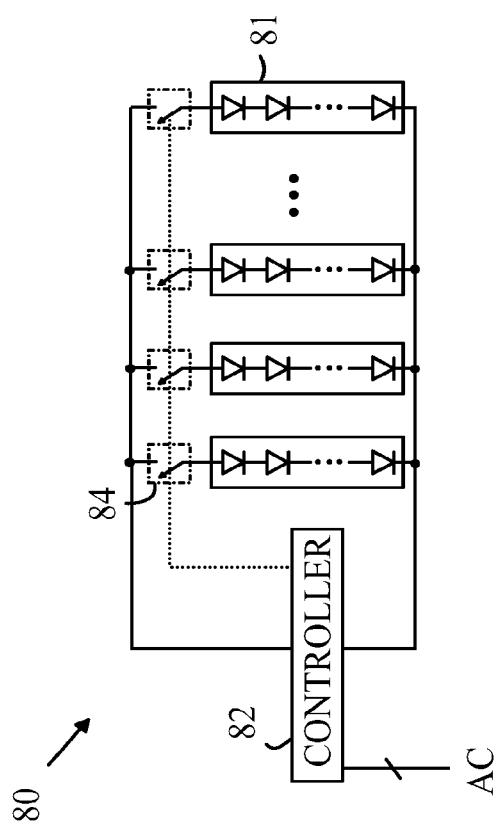
FIG. 7 illustrates one aspect of the present invention in a light source according to one embodiment of the present invention.

The Segmented LEDs require less drive current than conventional LEDs generating the same light, since the Segmented LEDs operate at higher voltages. As a result, a switch can be connected in series with a Segmented LED without substantially altering the efficiency of the Segmented LED due to power dissipation in the switch. Refer now to FIG. 7, which illustrates this aspect of the present invention in a light source according to another embodiment of the present invention. Light source 80 is constructed from a plurality of Segmented LEDs 81 that are powered from controller 82. Each Segmented LED is connected to one of the power rails by a switch 84 that is under the control of controller 82. Controller 82 can utilize the switch to remove a Segmented LED that fails by forming a short circuit. In addition, controller 82 can increase or decrease the brightness of light source 80 by actuating one or more of the switches. Although the switches are shown as mechanical switches, it is to be understood that any type of switch having sufficiently low impedance in the conducting state could be utilized including transistors or other semiconductor-based devices that can even be integrated with the controller as a single driver IC.

As noted above, one of the important advantages of utilizing Segmented LEDs in the present invention is the ability to provide a light source that operates from a significantly higher potential than conventional LEDs while breaking up the light source into sufficient component light sources to compensate for the variability in light generation between the various component light sources.

Consider a light source that is constructed from individual LEDs that have a manufacturing variation characterized by σ. As noted above, this variation arises from variations across individual wafers on which the LEDs are fabricated and on wafer-to-wafer variations in any given production run. For example, the variation in light output from LED to LED could be approximated by a Gaussian distribution having a standard deviation σ, although the precise form of the distribution of LED outputs is not critical in the following discussion.

In general, the final light source must meet some design specification related to the variation in light output from light source to light source and the uniformity of light intensity within each light source. The design tolerance assures that the light sources are interchangeable. That is, the light outputs of different manufactured light sources are indistinguishable in appearance and intensity to an observer of the light from the light sources.

Refer now to FIG. 8, which illustrates a light source 90 according to another embodiment of the present invention. Consider the case in which M component light sources 91 are connected in parallel between two power rails 92 and 93 that can accommodate a variable number of light sources. M is chosen such that, on average, M component light sources generate the desired light output as specified in the design specification of the light source. Assume that the average light output of each component light source is less than the variation in the light output specified by the design tolerance. In this case, one could populate the light source with M component light sources and measure the light output. If the output is too high, one or more component light sources are removed to bring the output of the light source within the design specification. If the output is too low, one or more component light sources are added to the light source.

In the prior art, the component light sources are series connected strings of conventional LEDs so that each component light source can be operated at a potential that can be efficiently provided. Consider a light source that is designed to provide 2000 lumens of light (about the equivalent of a 100 watt incandescent light). Conventional LEDs that generate 80 lumens provide a good compromise between yield and die size. Hence, 25 such LEDs, or 5 series connected strings are utilized between the power rails. Hence, each component light source generates about 20 percent of the target light output, and the removal or addition of one such string would result in a 20 percent change in the light output of the light source, which would exceed the typical design tolerances allowed for such light sources. Hence, the LEDs must be matched within each series string to assure that the light output of each series string has a small enough variance to assure that precisely 5 strings will provide the target output to within the design tolerance. The cost of this type of binning and matching is significant for inexpensive light sources.

Alternatively, controller 94 could be programmed for each light source to provide more or less current to the power rails, and hence, compensate for the variation in the outputs of the individual LEDs. This procedure requires measuring the light output of each light source and varying the current to provide the desired result. The controller must include a variable output current source and storage for a parameter that specifies the correct current. Such controllers increase the cost over the simple controller required by a light source that utilizes 25 Segmented LEDs and is adjusted by adding or subtracting Segmented LEDs from the power rails.

The arrangement shown in FIG. 8 can also be used to construct an AC LED light source in which the individual component light sources are powered directly from an AC power source that has been rectified by a full-wave rectifier bridge to provide essentially DC voltage that can be applied across each component light source composed of M series-connected strings of N-segment segmented LEDs such that the total number M*N of LED junctions times the typical operating voltage Vf of a conventional LED equals approximately the peak voltage $V_{pk}$ (equal to square-root of two times the rms voltage) of the rectified-AC voltage. Typically, $M*N*V_f$ is chosen slightly less than $V_{pk}$ in order to overdrive the LEDs some of the time to compensate for the time when the LEDs are not turned ON when the voltage is less than their turn-ON voltage. Alternatively, a large capacitor (generally needs to be of the electrolytic type to provide the high capacitance at high voltage necessary for such applications) can be connected in parallel to turn on the LEDs during those "OFF times" by discharging through them. This concept is well known but involves the use of costly and low life-time capacitors which increases cost and reduces the lifetime of the light source. Refer now to FIG. 9, which illustrates an AC light source according to one embodiment of the present invention. Light source 100 is similar to light source 90 discussed above with reference to FIG. 8 in that a variable number of component light sources are connected between power rails 92 and 93, the number of light sources being chosen to provide the desired light output to within a design tolerance. Light source 100 differs from light source 90 in that controller 104 provides an AC output voltage between the power rails and half the component light sources, e.g. 101, 102 are connected across the power rails in the opposite orientation. On each half cycle of the AC power signal, half of the component light sources will generate light and the other half will be off. This method does require twice as many LEDs but saves the cost and complexity of adding rectifier diodes.

In one aspect of the present invention, controller 104 includes a transformer having a fixed primary to secondary ratio. Such embodiments are particularly attractive from a cost point of view. However, the output voltage signal applied to the power rails is subject to the variability of the transformer manufacturing process. By varying the number of component light sources that are connected across the power rails at the time of manufacture, the light source can be adjusted to provide a standard output independent of the variations in controller 104, thus providing a lower cost light source than sources that require a variable output controller to compensate for manufacturing variations.

The above described light sources depend on adjusting the number of component light sources connected to the power rails at the time of manufacture to compensate for differences in the light output of the individual component light sources or the output of the controller that powers the component light sources. In one aspect of the present invention, the number of component light sources is adjusted by starting with a light source that has M component light sources, where M is chosen such that the light source will have either the correct number or one or two additional component light sources that are not needed to provide the design light output. The light source is tested after assembly. The light source will either have the correct light output or an output that is too high. If the output is too high, a link 106 in one of the power rails is interrupted by laser ablation or a similar process to prevent one of the component light sources from being powered during normal operation. The light source could have multiple links of this type to allow more than one component light source to be removed.

This method provides an assembly process that can be completely automated at the cost of including one or two additional component light sources. If the component light sources are Segmented LEDs, the cost is essentially the same as that of an additional LED die or two, which is acceptable in many applications.

It should be noted that some binning of the LEDs, even in the case of Segmented LEDs, is required to provide uniformity over the light source. The physical size of a light source with multiple LEDs is sufficiently large to allow a user to detect local non-uniformities arising from LEDs that have sufficiently different light output. In general, the variation in light intensities from manufacturing variations is greater than the maximum variability allowed within a light source. Such variations in light output occur across a wafer or from wafer to wafer on a production run. Accordingly, the LEDs must be sorted into bins having similar light output to assure that all of the LEDs in any given bin are sufficiently uniform when viewed by an observer.

Denote the maximum allowable variation of the Segmented LEDs across a light source by $\sigma_m$. That is, the Segmented LEDs with a light source must have an intensity within the range of intensities defined by $I \pm \sigma_m$. In general, the manufacturing variation is characterized by $\sigma > \sigma_m$. Hence, the Segmented LEDs are divided into non-overlapping groups ("bins") in which each group is characterized by a mean light intensity. Consider a process in which there are two such groups characterized by mean intensities of $I_1$ and $I_2$, respectively. The minimum number of Segmented LEDs used to fabricate a light source is chosen such that, $MI_1$ is equal to $(M+1)I_2$ to within the design specification for the light source. Typically, the variation within any bin is approximately 10 percent.

For example, consider the case in which a 2000 lumen light source is to be constructed from Segmented LEDs that are nominally 80 lumens per Segmented LED. Suppose the Segmented LEDs vary from 70 lumens per Segmented LED to 90 lumens per Segmented LED across a lot of wafers. The Segmented LEDs are binned into 4 bins, the first being Segmented LEDs having outputs from 70 to 75 lumens, the second being Segmented LEDs having outputs from 75 to 80 lumens, the third bin being Segmented LEDs having outputs from 80 to 85 lumens, and the fourth bin being Segmented LEDs having outputs from 85 to 90 lumens. The target light source can be constructed by utilizing 29 Segmented LEDs from the first bin, or 26 Segmented LEDs from the second bin, or 23 Segmented LEDs from the third bin, or 22 Segmented LEDs from the fourth bin. Since the power rails accommodate a variable number of Segmented LEDs, each choice for the light source can utilize the same circuit carrier and layout and essentially all of the Segmented LEDs from the manufacturing run can be utilized. In addition, the light sources do not need to be measured and trimmed after production to meet the design specification. However, such measurement and trimming could be utilized to further reduce the variability from final light source to light source.

As noted above, the preferred component light source is a Segmented LED. In general, to provide efficient delivery of power to the component light sources that are connected in parallel, the component light sources must operate at a voltage that is substantially greater than that of a single junction LED, which is typically 3.2 volts for GaN-based LEDs. In one embodiment of the present invention, a Segmented LED with 5 segments is utilized to provide a component light source with a 16V drive voltage. However, component light sources with a drive voltage of at least 3 times that of a single junction LED in the material system in question can be advantageously utilized.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
   a substrate having first and second power rails; and
   a plurality of segmented LEDs connected between the first and second power rails,
   wherein each segmented LED is configured to generate light when a power signal is applied to the first and second power rails;
   wherein the plurality of segmented LEDs are provided by a single LED die that is divided into N segments serially connected to each other, with N being ≥1, and wherein each segmented LED comprises a size that is 1/N times a size of a single junction LED fabricated in a same material as the segmented LED.

2. The light source of claim 1, wherein N is between 2 and 100.

3. The light source of claim 1, wherein each segmented LED is configured to generate light at an intensity that is less than 10% of a total light intensity generated by the light source.

4. The light source of claim 1, further comprising a power bus configured to power a variable number of the plurality of segmented LED, with the power bus including at least one breakable link that is configured to permanently disconnect at least one respective segmented LED from the power bus when said link is broken.

5. The light source of claim 4, wherein the power bus comprises the first and second power rails, and the light source further comprises a controller configured to receive AC power and provide the power signal to the power bus comprising the first and second power rails in response to receiving the AC power.

6. The light source of claim 1, wherein a first portion of the plurality of segmented LEDs are arranged in a first orientation and a second portion of the plurality of segmented LEDs are arranged in a second orientation opposite the first orientation.

7. The light source of claim 1, wherein each segmented LED comprises a three-layer LED structure disposed on the substrate.

8. The light source of claim 7, wherein the three-layer LED structure comprises a n-layer, an active layer on the n-layer, and a p-layer on the active layer, and wherein each segmented LED is separated by an isolation trench that extends through the p-layer.

9. The light source of claim 1, wherein each segmented LED requires a driving voltage that is 3 times greater than a driving voltage of a single junction LED in order to generate the light at a predetermined intensity.

10. The light source of claim 9, wherein each segmented LED requires a current that is N times smaller than a current required by the single junction LED to generate the light at the predetermined intensity.

11. The light source of claim 9, wherein each segmented LED requires the driving voltage to be greater than 9.6 volts.

12. A light source comprising:
a substrate having first and second power rails; and
a plurality of segmented LED light sources connected between the first and second power rails, wherein each segmented LED light source is divided into N segments serially connected to each other, with N>1,
wherein each segmented LED light source is configured to generate light when a power signal is applied to the first and second power rails, and
wherein each segmented LED light source comprises a size that is 1/N times a size of a single junction LED fabricated in a same material as the segmented LED.

13. The light source of claim 12, wherein N is between 2 and 100.

14. The light source of claim 12, wherein each segmented LED light source is configured to generate light at an intensity that is less than 10% of a total light intensity generated by the light source.

15. The light source of claim 12, further comprising a power bus configured to power a variable number of the plurality of segmented LED light sources and including at least one breakable link that permanently disconnects at least one respective segmented LED light source from the power bus when said link is broken.

16. The light source of claim 15, wherein the power bus comprises the first and second power rails, and the light source further comprises a controller configured to receive AC power and provide the power signal to the power bus comprising the first and second power rails in response to receiving the AC power.

17. The light source of claim 12, wherein a first portion of the plurality of segmented LED light sources are arranged in a first orientation and a second portion of the plurality of segmented LED light sources are arranged in a second orientation opposite the first orientation.

18. The light source of claim 12, wherein each segmented LED light source comprises a three-layer LED structure disposed on the substrate and includes a n-layer, an active layer on the n-layer, and a p-layer on the active layer, and wherein each segmented LED light source is separated by an isolation trench that extends through the n-layer.

19. The light source of claim 12, wherein each segmented LED light source requires a driving voltage that is N times greater than a driving voltage of a single junction LED in order to generate the light at a predetermined intensity.

20. The light source of claim 19, wherein each segmented LED light source requires the driving voltage to be 3 times greater than the driving voltage of the single junction LED.

21. The light source of claim 20, wherein each segmented LED light source requires a current that is N times smaller than a current required by the single junction LED to generate the light at the predetermined intensity.

22. The light source of claim 20, wherein each segmented LED light source requires the driving voltage to be greater than 9.6 volts.

* * * * *